(12) United States Patent
Burgess et al.

(10) Patent No.: US 8,505,337 B2
(45) Date of Patent: Aug. 13, 2013

(54) METHODS FOR FORMING FRITTED COVER SHEETS AND GLASS PACKAGES COMPRISING THE SAME

(75) Inventors: Debra L. Burgess, Horseheads, NY (US); Michael D. Burgess, legal representative, Horseheads, NY (US); Edward J. Sever, Littleton, NC (US); Brian P. Strines, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 465 days.

(21) Appl. No.: 12/821,581

(22) Filed: Jun. 23, 2010

(65) Prior Publication Data

US 2011/0014427 A1    Jan. 20, 2011

Related U.S. Application Data

(60) Provisional application No. 61/226,342, filed on Jul. 17, 2009.

(51) Int. Cl.
*C03C 27/06* (2006.01)
*H01J 9/26* (2006.01)

(52) U.S. Cl.
USPC ............ 65/43; 65/36; 65/58; 445/23; 445/25; 445/44

(58) Field of Classification Search
USPC .................. 65/36, 43, 58; 445/23–25, 44–45
See application file for complete search history.

(56) References Cited

U.S. PATENT DOCUMENTS

| | | | | |
|---|---|---|---|---|
| 6,495,262 | B2 * | 12/2002 | Igeta | 428/426 |
| 6,717,052 | B2 * | 4/2004 | Wang et al. | 174/381 |
| 6,861,801 | B2 * | 3/2005 | Kim et al. | 313/512 |
| 6,998,776 | B2 | 2/2006 | Aitken et al. | 313/512 |
| 7,815,480 | B2 * | 10/2010 | Logunov et al. | 445/25 |
| 8,063,561 | B2 * | 11/2011 | Choi et al. | 313/512 |
| 8,134,293 | B2 * | 3/2012 | Logunov et al. | 313/512 |
| 2003/0066311 | A1 * | 4/2003 | Li et al. | 65/43 |
| 2003/0090615 | A1 * | 5/2003 | Park | 349/153 |
| 2003/0122476 | A1 * | 7/2003 | Wang et al. | 313/493 |
| 2003/0127976 | A1 * | 7/2003 | Kim et al. | 313/504 |
| 2007/0172971 | A1 * | 7/2007 | Boroson | 438/26 |
| 2009/0009063 | A1 * | 1/2009 | Botelho et al. | 313/504 |

FOREIGN PATENT DOCUMENTS

| | | |
|---|---|---|
| EP | 1 814 182 | 8/2007 |
| EP | 1 965 452 | 9/2008 |
| KR | 10-2008-0033619 | 4/2008 |
| WO | 2005/050751 | 6/2005 |

\* cited by examiner

*Primary Examiner* — Jason L. Lazorcik
(74) *Attorney, Agent, or Firm* — Kevin M. Able

(57) ABSTRACT

A method for forming a fritted cover sheet includes providing a substrate and depositing an initial frit bead on the substrate. Thereafter, at least one additional frit bead is deposited on the substrate such that a base of the at least one additional frit bead contacts a base of an adjacent frit bead thereby forming a frit seal on the substrate.

14 Claims, 7 Drawing Sheets

METHODS FOR FORMING FRITTED COVER SHEETS AND GLASS PACKAGES COMPRISING THE SAME

This application claims the benefit of U.S. application Ser. No. 61/226,342, filed on Jul. 17, 2009. The content of this document and the entire disclosure of publications, patents, and patent documents mentioned herein are incorporated by reference.

BACKGROUND

1. Field

The present specification relates generally to fritted cover sheets for sealing glass packages and, more particularly, to methods of forming fritted cover sheets and glass packages comprising the same.

2. Technical Background

U.S. Pat. No. 6,998,776 discloses a method for frit sealing a glass package using a radiation-absorbing glass frit. As generally described in U.S. Pat. No. 6,998,776, a glass frit is deposited in a closed line (typically in the shape of a picture frame) on a first glass substrate and heated to pre-sinter the frit. The first glass substrate is then placed overtop a second glass substrate with the frit disposed between the first and second substrates. A laser beam is subsequently traversed over the frit (typically through one or both of the substrates) to heat and melt the frit, creating a hermetic seal between the substrates.

One use for such a glass package is in the manufacture of organic light emitting diode (OLED) display devices. An exemplary OLED display device comprises a glass substrate on which is deposited a first electrode material, one or more layers of organic electroluminescent material, and a second electrode material. One characteristic of the organic electroluminescent material is its susceptibility to both moisture and oxidation thus necessitating that the organic electroluminescent material be hermetically sealed between two glass substrates to prevent degradation of the electroluminescent material.

As OLED display devices are incorporated into a wider array of commercial products, the ability to produce OLED display devices which are suitably sealed to prevent long-term degradation of the electroluminescent material has become increasingly important as degradation of the electroluminescent material often destroys the functionality of the commercial product in which the OLED device is incorporated.

SUMMARY

According to one embodiment, a method for forming a fritted cover sheet includes providing a substrate and depositing an initial frit bead on the substrate. Thereafter, at least one additional frit bead is deposited on the substrate such that a base of the at least one additional frit bead contacts a base of an adjacent frit bead thereby forming a frit seal on the substrate.

In another embodiment, a method for forming a glass package may include providing a first substrate and a second substrate and depositing an initial frit bead on the first substrate. A second frit bead may then be deposited on the first substrate such that a base of the second frit bead contacts a base of the initial frit bead to form a frame-like frit seal on the first substrate. The first substrate may then be positioned on the second substrate such that the frit seal is disposed between the first substrate and the second substrate. The frit seal may then be heated to form a seal between the first substrate and the second substrate.

In another embodiment, a fritted cover sheet for sealing a glass package includes a frit seal deposited on a substrate. The frit seal may enclose a sealing area on the glass substrate. The frit seal may have a top surface extending between a pair of tapered sidewalls. The top surface of the frit seal may include at least three primary frit peaks. A spacing between adjacent primary frit peaks may be less than about 1 mm.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
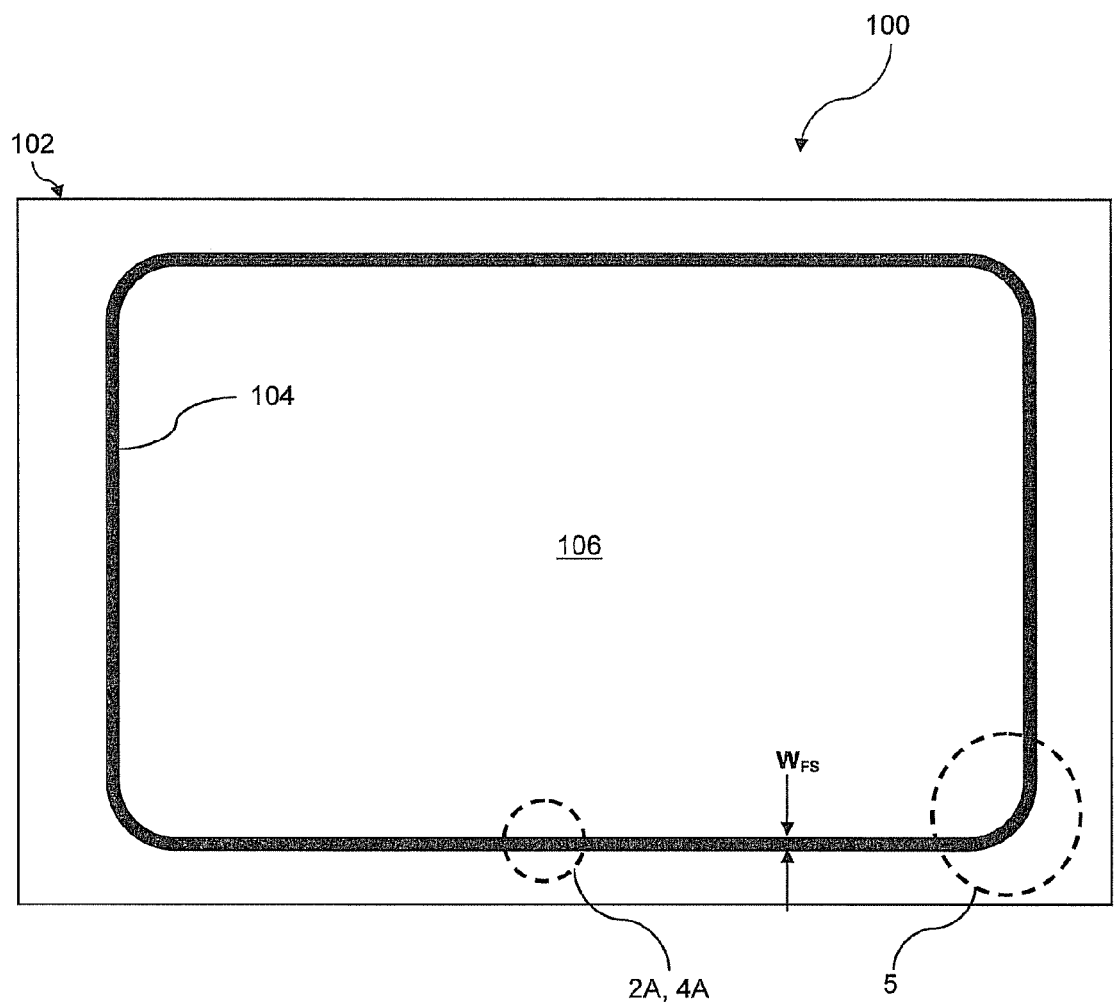
FIG. 1 depicts a fritted cover sheet for sealing a glass package comprising a frit seal deposited on a substrate.

Reference will now be made in detail to various embodiments of fritted cover sheets for use in sealing glass packages. Whenever possible, the same reference numerals will be used throughout the drawings to refer to the same or like parts. One embodiment of a fritted cover sheet is shown in FIG. 1, and is designated generally throughout by the reference numeral 100. The fritted cover sheet may generally comprise a transparent substrate and a frit seal. The fritted cover sheet and methods of forming and using the fritted cover sheet to seal a glass package, such as a display device or similar glass package, will be described in more detail herein.

Referring to FIG. 1, one embodiment of a fritted cover sheet 100 is shown. The fritted cover sheet 100 generally comprises a transparent substrate 102 having a frit seal 104 deposited on a frit application surface 106 of the substrate 102. The term "transparent," as used herein with respect to the substrate 102, refers to a substrate which has as transmittance of at least about 90% for a particular wavelength of radiant energy applied to the fritted cover sheet 100 in a subsequent sealing operation. For example, in one embodiment, the substrate 102 has a transmittance of at least about 90% for wavelengths of radiant energy from about 750 nm to about 950 nm which are used to heat the frit seal 104. In the embodiments described herein the substrate 102 may be a glass substrate made of, for example, EAGLE XG™ glass produced by Corning, Inc., or a similar glass material having a suitable transmittance. The transparent substrate 102 may generally comprise a frit application surface 106 positioned opposite a backing surface (not shown).

Still referring to FIG. 1, the frit seal 104 may be positioned on the frit application surface 106 of the substrate 102. The frit seal 104 may be deposited such that the frit seal 104 generally has a frame-like shape or pattern in the form of a line or band which closes on itself to form a contiguous circuit thereby generally defining a perimeter around a sealing area on the frit application surface 106 of the substrate 102. As depicted in FIG. 1, the frit seal 104 may be deposited on the frit application surface 106 such that the frame-like shape has curved or rounded corners. In the embodiments shown and described herein, the frit seal(s) 104 have a width $W_{FS}$ which may be greater than 0.5 mm and a height from about 12 microns to about 20 microns. However, it should be understood that frit seals having widths less than 0.5 mm and heights greater than 20 microns or less than 12 microns may be formed using the deposition techniques described herein.

In one embodiment, the frit seal 104 is a glass-based frit material which is deposited as a paste. The paste may generally comprise glass powder(s), a binder (usually organic) and/or a volatile liquid vehicle such as a solvent. In one embodiment, the frit seal 104 is formed from a low temperature glass frit that has a substantial optical absorption cross-section at a predetermined wavelength of radiant energy which matches or substantially matches the wavelength of radiant energy applied to the frit seal 104 in a subsequent sealing operation. For example, the glass frit may contain one or more radiant energy absorbing ions chosen from the group including iron, copper, vanadium, neodymium and combinations thereof. The glass frit may also be doped with a filler (e.g., an inversion filler or an additive filler) which modifies the coefficient of thermal expansion (CTE) of the glass frit such that the CTE of the glass frit more closely matches the CTE of both the transparent substrate and a device substrate to which the fritted cover sheet is subsequently sealed. It will be understood that various compositions of glass frit may be used to produce the frit seal. For example, some non-limiting examples of suitable frit compositions are disclosed in U.S. Pat. No. 6,998,776 entitled "Glass Package that is Hermetically Sealed with a Frit and Method of Fabrication" which is herein incorporated by reference.

The frit paste may be deposited on the substrate 102 to form the frit seal 104 with an extrusion-type applicator which dispenses a bead of frit paste onto the substrate 102 through a nozzle. The shape of the resulting frit bead is generally dictated by the size of the nozzle used to dispense the frit paste onto the substrate. For example, to deposit a frit bead with a width $W_{FB}$ of 0.6 mm, a nozzle having a diameter of about 0.55 mm may be used. However, it will be understood that smaller or larger nozzles may be used to deposit frit beads having the desired width. To achieve a frit seal with the desired dimensions and pattern, the applicator may be coupled to a computer controlled positioning system, such as, for example, a robotic arm or a computer-numeric-control (cnc) positioning system, which maneuvers the applicator over the substrate as the frit paste is dispensed from the applicator. The computer controlled positioning system may be programmed to maneuver the applicator in a predetermined pattern which, in turn, facilitates deposition of the frit bead in the desired pattern.

In the embodiments shown and described herein, the frit seal 104 may be formed on the substrate 102 by depositing a plurality of individual frit beads on the substrate 102 in the desired pattern (e.g., a frame-like pattern or similar pattern) such that each frit bead contacts and/or overlaps an adjacent frit bead thereby forming a frit seal 104 having the desired width. For example, to form a frit seal 104 having a width $W_{FS}$, an initial frit bead having a width $W_{FB} < W_{FS}$ may be deposited on the substrate 102. Thereafter, at least one additional frit bead having a width $W_{FB} < W_{FS}$ may be deposited on the substrate 102 such that the at least one additional frit head abuts or overlaps a base of an adjacent frit bead thereby forming a frit seal 104 having the desired width $W_{FS}$.

Figure 2A:
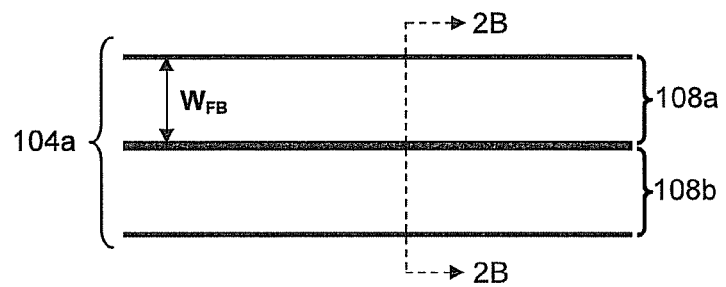
FIG. 2A depicts an enlarged view of a portion of the frit seal of FIG. 1 according to one embodiment described herein in which the frit seal is formed by depositing multiple frit beads on the substrate such that base of each frit bead abuts an edge of an adjacent frit bead.
Figure 2B:
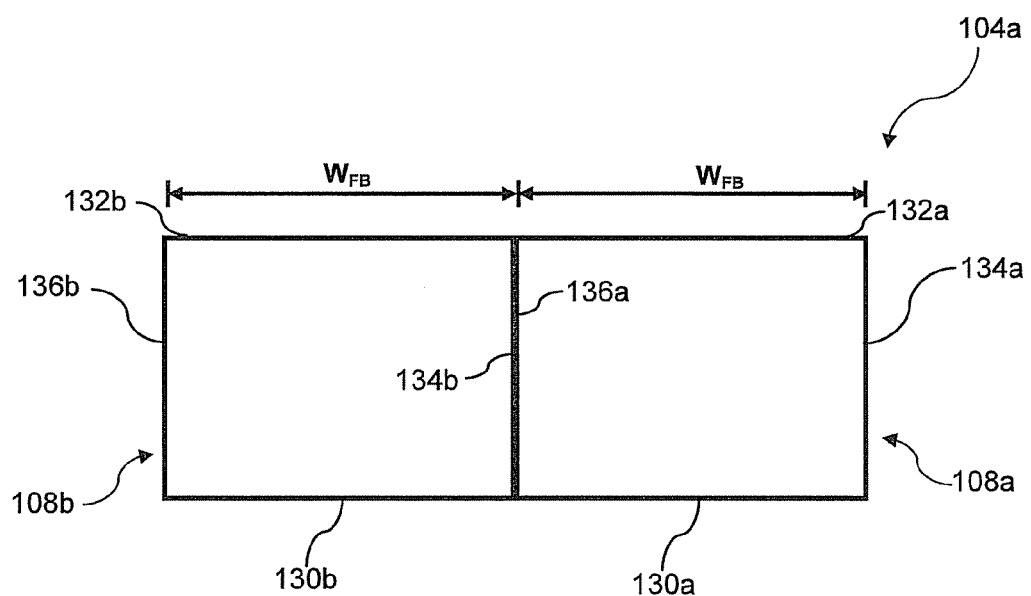
FIG. 2B depicts a cross section of the frit seal of FIG. 2A illustrating the relative orientation of adjacent frit beads according to one embodiment shown and described herein.

Referring now to FIGS. 1 and 2A-2B, one embodiment of a method for forming a fritted cover sheet 100 is graphically illustrated. In this embodiment, a plurality of frit beads 108a, 108b may be deposited on the frit application surface 106 of the substrate 102 to form a frit seal 104a having the desired width. To illustrate the basic principles of the methodology, frit beads 108a, 108b are depicted as having an idealized, rectangular cross section such that the frit beads 108a, 108b each comprise a base 130a, 130b parallel to a top surface 132a, 132b and parallel sides 134a, 136b and 134a, 136b. The base 130a, 130b of each frit bead 108a, 108b generally has a width $W_{FB}$ which, in this embodiment, is also the width of the corresponding top surfaces 132a, 132b.

The first frit bead 108a may be deposited on the frit application surface 106 of the substrate 102 by traversing the applicator over the frit application surface 106 in a predetermined pattern as frit paste is dispensed from the nozzle of the applicator. For example, in the embodiments described herein, the desired pattern is a rectangular, fame-like pattern with curved or rounded corners, as shown in FIG. 1. Thereafter, a second frit bead 108b may be deposited on the frit application surface 106 of the substrate 102 in a similar manner as the first frit bead 108a. The second frit bead 108b may be deposited adjacent to the preceding frit bead (i.e., the first frit bead 108a) such that the sidewall 134b of the second frit bead 108b directly contacts and abuts the sidewall 136a of the first frit bead 108a. Accordingly, in this embodiment, at least the base 130b of the second frit bead 108b contacts the corresponding base 130a of the first frit bead 108a such that the first frit bead 108a and second frit bead 108b, together, form the frit seal 104a such that the frit seal 104a has a width $W_{FS}=2*W_{FB}$.

It should be understood that two or more frit beads of various widths $W_{FB}$ may be deposited to form a frit seal having the desired width $W_{FS}$. For example, when a frit seal 104a having a width $W_{FS}$ of 1.2 mm is desired, first and second frit beads 108a, 108b each having a width of 0.6 mm may be deposited on the frit application surface 106 of the substrate 102 as described herein such that the frit seal 104a has a width of 1.2 mm. When a frit seal having a width of 1.5 mm is desired, three frit beads each having a width of 0.5 mm may be deposited to form a frit seal having the desired width. Accordingly, it should be understood that a frit seal having the desired width may be formed by depositing two or more frit beads of smaller width in the manner described herein.

As noted herein, the frit beads 108a, 108b shown in FIG. 2B have an idealized rectangular cross section. However, in other embodiments, the frit beads dispensed by the applicator may have a tapered configuration thereby necessitating that consecutive frit beads both contact and overlap one another to form a frit seal having the desired width.

Figure 3A:
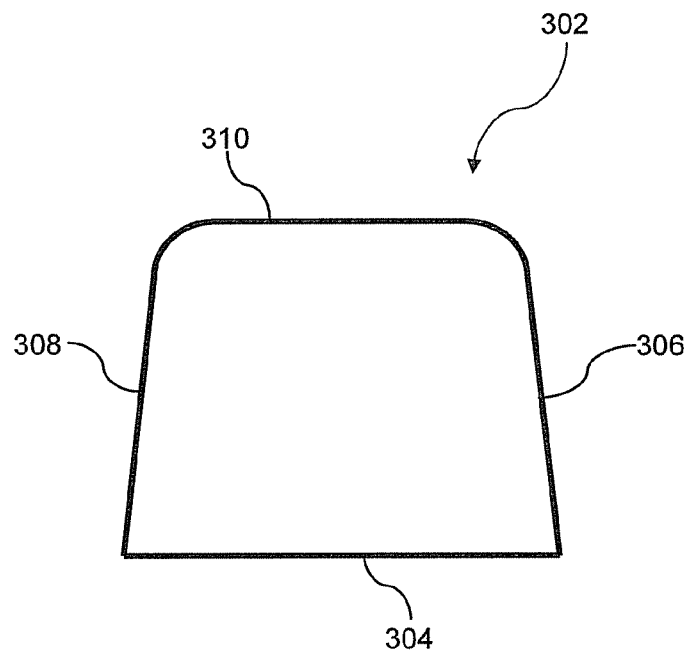
FIGS. 3A and 3B depict cross sections of two embodiments of frit beads with tapered configurations.
Figure 3B:
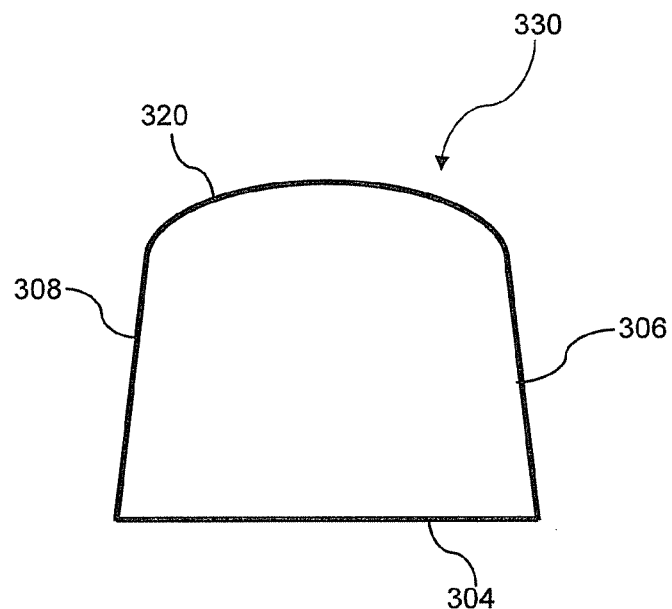

For example, referring to FIGS. 3A and 3B, cross sections of two embodiments of frit beads 302, 330 are depicted in which the frit beads 302, 330 have tapered configurations. In one embodiment, the frit bead 302 dispensed by the applicator may have a base 304 with sidewalls 306, 308 which taper toward the top surface 310. Accordingly, it should be understood that the top surface 310 is narrower than the base 304. In the embodiment of the frit bead 302 shown in FIG. 3A, the sidewalls 306, 308 transition into the top surface 310 with rounded corners. In an alternative embodiment illustrated in FIG. 3B, the frit bead 330 comprises a base 304 with sidewalls 306, 308 which taper towards an arched top surface 320. Accordingly, it will be understood that the frit beads dispensed with the applicator may have a tapered configuration with sidewalls which taper from the base towards a top surface. In either embodiment, the width of the frit head $W_{FB}$ is the width of the base of the frit bead.

Figure 4A:
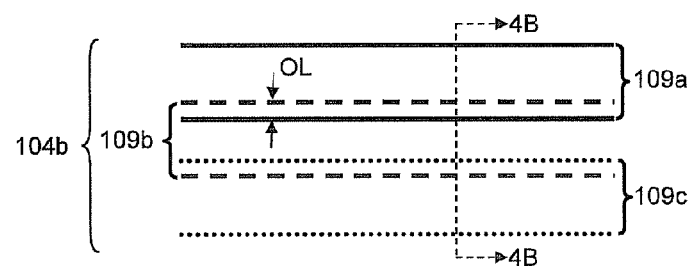
FIG. 4A depicts an enlarged view of a portion of the frit seal of FIG. 1 according to one embodiment described herein in which the frit seal is formed by depositing multiple frit beads on the transparent substrate such that a portion of the base of each frit bead overlaps a portion of the base of an adjacent frit bead.
Figure 4B:
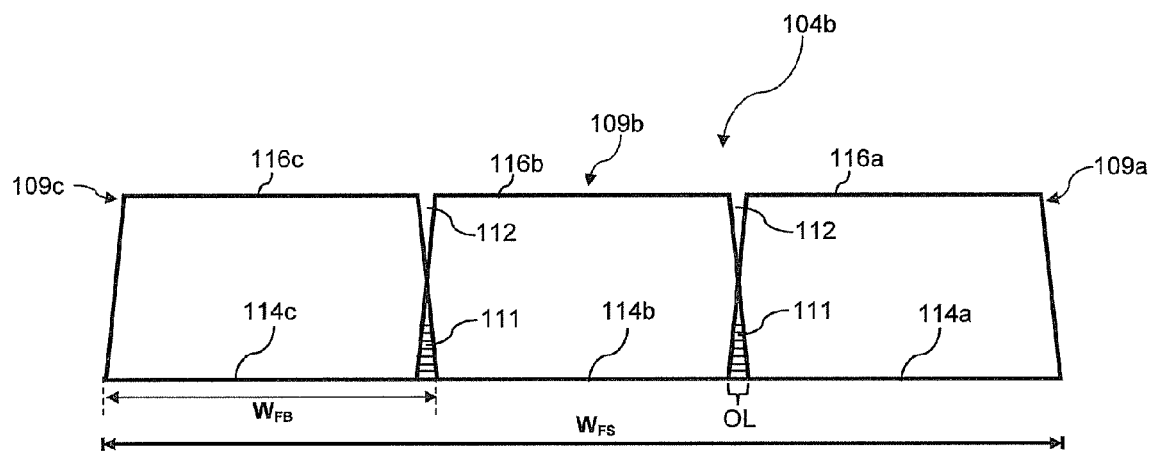
FIG. 4B depicts a cross section of the frit seal of FIG. 4A illustrating the relative orientation of adjacent frit beads according to one embodiment shown and described herein.

Referring now to FIGS. 1, 4A and 4B, in order to form a frit seal 104b from a plurality of frit beads having a tapered configuration, each frit bead may be deposited on the frit application surface 106 of the substrate 102 such that the base of each frit bead contacts and overlaps a base of an adjacent frit bead. For example, referring to FIGS. 4A and 4B, one embodiment of a frit seal 104b is depicted in which the frit seal 104b is formed from three overlapping frit beads 109a, 109b, 109c. As shown in FIG. 4A, a base of each frit bead overlaps the base of an adjacent frit bead. Each of the overlapping frit beads has a width $W_{FB}$ and a tapered cross sectional configuration which, for purposes of illustration, is depicted as trapezoidal.

An initial frit bead 109a may be deposited on the frit application surface 106 of the substrate 102 by traversing the applicator over the frit application surface 106 in a predetermined pattern as frit paste is dispensed from the nozzle of the applicator, as described above. Thereafter, at least one additional frit bead is deposited on the frit application surface 106 such that the at least one additional frit bead contacts and overlaps a base of the adjacent frit bead. In the present example, the second frit bead 109b is deposited on the frit application surface 106 of the substrate 102 such that the base 114b of the second frit bead 109b overlaps the base 114a of the first frit bead 109a by an amount indicated by OL. Due to the tapered configuration of the frit beads 109a, 109b, the glass frit material in the overlapping area 111 between the frit beads 109a, 109b, which is shown in FIG. 4B for purposes of illustration, is actually deposited in the area 112 between the top surface 116a of frit bead 109a and the top surface 116b of frit bead 109b thereby forming a continuous top surface between the first frit bead 109a and the second frit bead 109b.

Figure 4C:
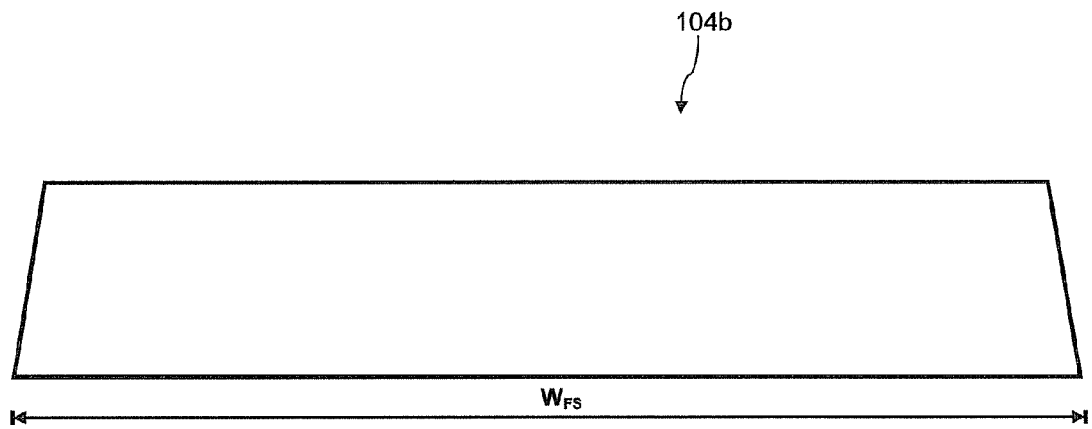
FIG. 4C depicts a cross section of the frit seal of FIG. 4A according to one embodiment shown and described herein.

Thereafter, a third frit bead 109c may be deposited such that the base 114c of the third frit bead 109c contacts and overlaps the base 114b of the second frit bead 109b thereby forming a continuous top surface between the third frit bead 109c, the second frit bead 109b and the first frit bead 109a. The process may be repeated by depositing additional frit beads in the same manner until a frit seal 104b is formed with the desired width $W_{FS}$, as depicted in FIG. 4C.

For example, a frit seal having a width $W_{FS}$ of 2.6 mm may be formed by depositing five frit beads having a tapered cross sectional configuration and a width $W_{FB}$ of 0.6 mm. The frit beads may be deposited such that a base of each frit bead contacts and overlaps a base of an adjacent frit bead by about 0.1 mm thereby producing a frit seal having a width $W_{FS}$ of 2.6 mm.

In the embodiments and examples of both the rectangular and tapered configuration frit beads shown and described herein, the frit beads have generally been described as having a width $W_{FB}$ of less than about 1 mm while the frit seals formed from such frit beads have a width $W_{FS}$ greater than about 1 mm. Further, where an overlap is used in conjunction with frit beads having widths less than about 1 mm, the amount of overlap between adjacent frit beads may be from about 0.05 mm to about 0.5 mm. However, it should be understood that these widths and overlap amounts are exemplary and that the techniques for forming frit seals described herein may be used to form frit seals with widths less than about 1 mm and, when the frit beads overlap, the overlap amounts may be less than 0.05 mm or greater than about 0.5 mm. Further, it should also be understood that the techniques for forming frit seals described herein may also be used in conjunction with frit beads having widths greater than about 1 mm.

Further, while the embodiments and examples shown and described herein describe forming a frit seal by depositing multiple frit beads of substantially the same width, it should be understood that multiple frit beads of differing widths may be deposited to form a frit seal of suitable width using the techniques described herein.

Figure 5:
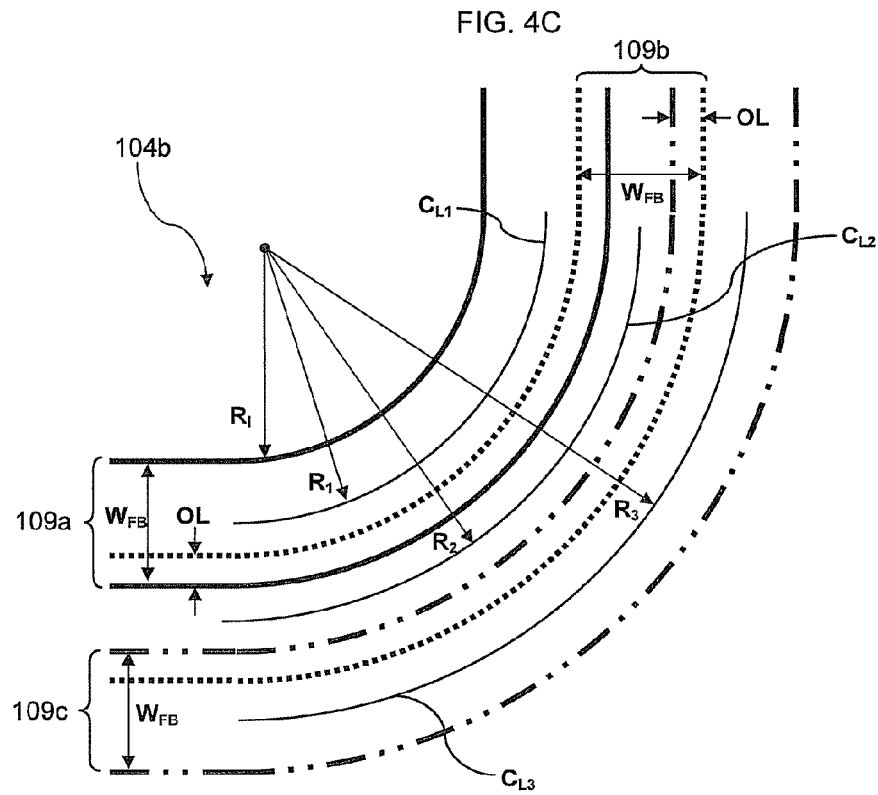
FIG. 5 depicts an enlarged view of a curved portion of the frit seal of FIG. 1 according to one embodiment shown and described herein in which adjacent frit beads are deposited with increasing centerline radii to form the curved portion of the frit seal of FIG. 1.

Referring now to FIGS. 1 and 5, using the multi-pass deposition techniques described herein the frit seal may be deposited with a frame-like shape such that the frit seal closes on itself to form a contiguous circuit, as depicted in FIG. 1, where the frit seal 104 forms a frame with rounded corners on the frit application surface 106 of the substrate 102. Accordingly, it will be understood that the frit seal 104 may be deposited in a pattern which comprises at least one curved portion. In order to maintain the desired overlap (or lack of overlap) in the curved portion of the frame or pattern, the radius of curvature for each consecutively deposited frit bead may be different than the previously deposited frit bead. Referring to FIG. 5, the radius of curvature of a frit bead forming the frit seal 104b refers to the radius of curvature of a line positioned at the center of the frit bead, such as the center lines $C_{L1}$, $C_{L2}$, $C_{L3}$. In order to form a frit bead having a desired radius of curvature, the applicator is traversed over the substrate in an arc having the radius of curvature of the corresponding centerline as frit paste is dispensed from the applicator.

When the frit seal 104b is formed from the inside of the substrate to the edge of the substrate (e.g., from frit bead 109a to frit bead 109c), each consecutively deposited frit bead may have a centerline radius of curvature in the curved portion(s)

of the frame-like pattern which is greater than the centerline radius of curvature of a preceding frit bead. Conversely, when the frit seal 104b is formed from the edge of the substrate towards the center of the substrate (e.g., from frit bead 109c to frit bead 109a), each consecutively deposited frit bead may have a centerline radius of curvature which is less that the centerline radius of curvature of a preceding frit bead.

In one embodiment, the centerline radius of curvature for each frit bead deposited to form the frit seal 104b is determined based on the inner radius ($R_1$) of the curved portion of the pattern in which the frit bead is being deposited, the width of each frit bead ($W_{FB}$), the overlap amount (OL) between adjacent frit beads, and the number of frit bead deposition passes (P).

For example, referring to the frit seal 104B shown in FIG. 5 which is formed by depositing three overlapping frit beads (i.e., P=3), the centerline radius of curvature $R_1$ of the innermost frit bead of the frit seal, specifically frit bead 109A may be calculated using the equation:

$$R_1 = R_I + \frac{W_{FB}}{2}. \quad (1)$$

The centerline radius of curvature $R_2$ for the next subsequent frit bead, frit bead 109B may be written as:

$$R_2 = R_1 + W_{FB} - OL \quad (2).$$

The centerline radius of curvature $R_3$ for the next subsequent frit bead 109C may be written as:

$$R_3 = R_2 + W_{FB} - OL \quad (3).$$

Accordingly, based on the forgoing, the centerline radius of curvature $R_J$ for the Jth frit bead in a frit seal comprising P frit beads may be written as:

$$R_J = R_I + \frac{W_{FB}}{2} + (J-1)(W_{FB} - OL), \quad (4)$$

where J is an integer from 1 to P (i.e., from one to the total number of frit beads). Table 1 below shows the calculated centerline radii for each of three consecutive frit beads each having a width $W_{FB}$ of 0.6 mm, and an overlap amount OL of about 0.1 mm to form a frit seal with an inner radius of curvature $R_1$ of 1 mm and a total width of 1.6 mm.

TABLE 1

Calculated Centerline Radii

| $R_J$ | Radius of Curvature |
|---|---|
| R1 | 1.3 |
| R2 | 1.8 |
| R3 | 2.3 |

In another embodiment, the centerline radius of curvature for each frit bead may be determined utilizing equation (4) from above in conjunction with the inner radius ($R_I$) of the corner in which the frit bead is being deposited, the desired width of the frit seal ($W_{FS}$), the overlap amount (OL) between adjacent frit beads, and the number of frit beads (P) making up the frit seal. In this embodiment, the width $W_{FB}$ of each frit bead may be calculated based on the width $W_{FS}$ of the frit seal, the number of frit beads P and the amount of overlap OL such that:

$$W_{FB} = \frac{W_{FS}}{P} + OL\left(\frac{P-1}{P}\right). \quad (5)$$

The calculated value for $W_{FB}$ may be substituted into Equation (4) and the centerline radius of curvature for each frit bead may be calculated for each of J frit beads where J is an integer from 1 to P.

Alternatively, when the frit bead width is known but the total frit seal width is unknown, Equation (5) may be rewritten as:

$$W_{FS} = W_{FB} * P - OL(P-1) \quad (6).$$

Using Equation (6), the width of the resulting frit bead may be determined based on the width, number and overlap amount of the deposited frit beads.

Once the centerline radius of curvature is calculated for each frit bead in the pattern of frit beads which ultimately form the frit seal 104b, each of the frit beads may be deposited on the frit application surface of the substrate using the selected overlap amount OL and calculated centerline radius of curvature thereby forming a frit seal 104b having the desired width $W_{FS}$.

Figure 6:
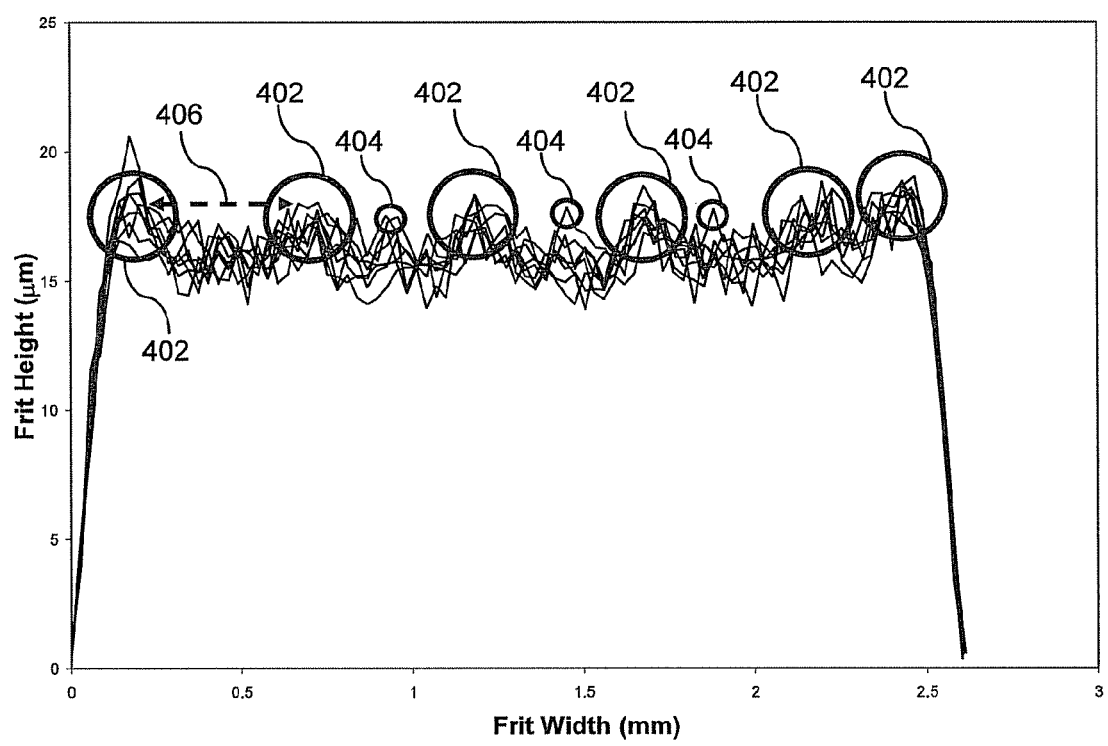
FIG. 6 is a chart graphically illustrating a plurality of cross sectional profiles of a frit seal formed according to one or more embodiments shown and described herein.

Referring now to FIG. 6, a graph of frit width vs. frit height is shown for a plurality of cross sections of a frit seal formed according to one embodiment described herein. The profile measurements were taken from a 2.6 mm frit seal which was formed on a transparent substrate by depositing five frit beads each having a width of 0.6 mm. The amount of overlap between adjacent frit beads was 0.1 mm. The profile of different cross sectional slices of the frit seal was measured with a Werth Fixed Bridge Inspector® FQ multi-sensor coordinate measuring machine.

As illustrated in FIG. 6, the top surface of the frit seal may comprise a series of peaks and valleys that are generally less than about 10 microns in height (e.g., from the tip of a peak to the bottom of an adjacent valley) such that the top surface of the frit seal generally has a variance of about +/−5 microns across the width of the frit seal. The peaks may be grouped into two categories. A first category of peaks is the primary frit peaks 402 which are formed at both the outside edges (e.g., the outside edges of the frit seal) and interior edges (e.g., at the intersection or overlap of adjacent frit beads) of the frit beads which make up the frit seal. In one embodiment, the frit seals formed according to the techniques described herein generally comprise at least three primary frit peaks (i.e., the frit seal is formed by depositing at least two frit beads). The second category of peaks is the secondary peaks 404 which are formed between the primary frit peaks 402. The secondary frit peaks 404 are generally smaller in both height and width than the primary frit peaks 402.

Reducing the spacing 406 between adjacent primary frit peaks 402 may improve the mechanical contact of the frit seal with the device substrate to which the fritted cover sheet is sealed. Improving the mechanical contact improves the thermal coupling between the frit seal and the device substrate to which the fritted cover sheet is sealed and results in a more even dissipation of the heat generated during sealing. Further, improving the mechanical coupling between the frit seal and the device substrate to which the fritted cover sheet is sealed also reduces the amount of force necessary to seal the fritted cover sheet to the device substrate. The improved thermal coupling and reduced sealing forces are particularly important when the sealed device substrate is used for a display device, such as an OLED display, where excessive heat and/or high sealing forces may damage the electroluminescent material, the leads coupled to the electroluminescent material and/or other circuitry. Reducing the spacing 406 between adjacent primary frit peaks 402 may be accomplished by reducing the width of the deposited frit beads.

Accordingly, in one embodiment, the methods described herein may be used to improve the mechanical contact between the formed frit seal and the device substrate to which the fritted cover sheet is sealed. A frit seal with the desired mechanical and thermal properties may be formed by depositing a plurality of frit beads having widths less than 1 mm using the techniques described herein such that the spacing between adjacent primary frit peaks on the top surface of the frit seal is less than about 1 mm.

Figure 7A:
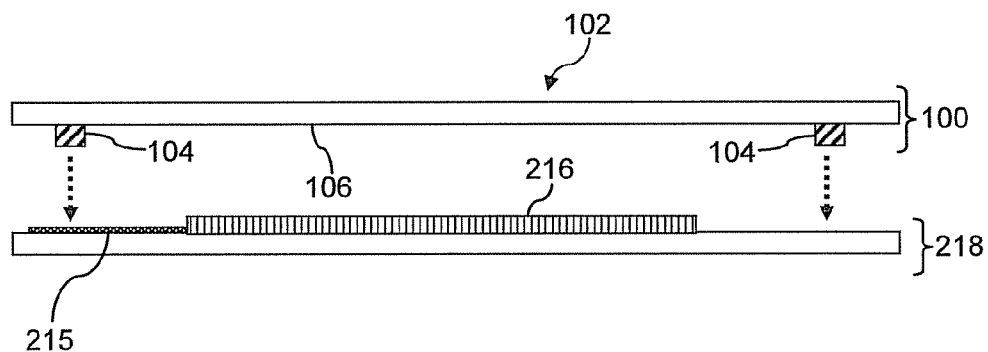
FIGS. 7A and 7B depict cross sectional views of a fritted cover sheet according to one embodiment shown and described herein being positioned on and sealed to a substrate comprising an electroluminescent device to form a display device.
Figure 7B:
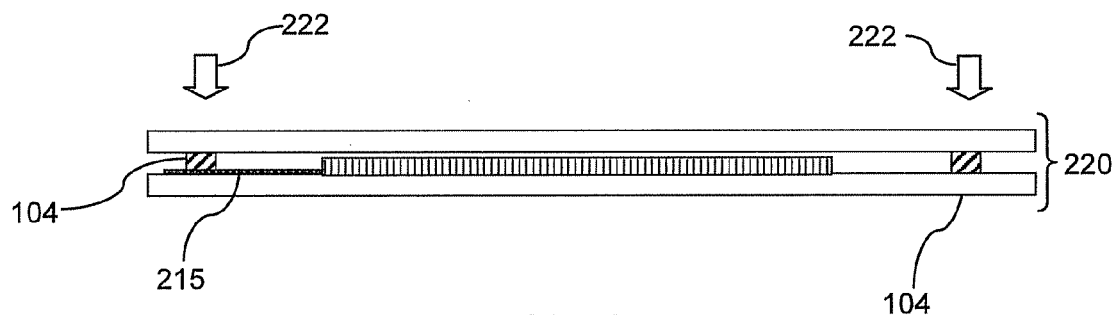

Referring now to FIGS. 7A and 7B, the fritted cover sheets formed as described herein may be used to seal a device substrate to form a glass package. In the embodiment shown in FIGS. 7A and 7B the fritted cover sheet 100 is used to seal a device substrate 218 having an electroluminescent device 216 and at least one electrical lead 215 positioned thereon to form a glass package which, in this embodiment, is a display device 220. For example, the electroluminescent device may be an OLED.

The fritted cover sheet 100 is first positioned on the device substrate 218 such that the electroluminescent device 216 is positioned between the frit application surface 106 of the fritted cover sheet 100 and the device substrate 218. With the fritted cover sheet 100 in this position the electroluminescent device 216 is positioned within the perimeter or frame defined by the frit seal 104. The electrical lead(s) 215 may extend beneath the frit seal 104. Thereafter, the frit seal 104 is irradiated with a suitable radiant energy 222 (represented by block arrows) by directing the radiant energy 222 through the fritted cover sheet 100. In some embodiments, the radiant energy 222 may be a laser beam having a wavelength which will be absorbed by the frit seal 104. For example, a laser beam having a suitable wavelength may be traversed over the fritted cover sheet 100 to irradiate and heat the frit seal 104.

The appropriate source and manner of irradiating the frit seal 104 will depend upon the frit composition to be heated and melted as well as the characteristics of the glass package which is being sealed (e.g., whether or not heat sensitive organic materials are used in the manufacture of the glass package). The radiant energy directed on to the frit seal 104 heats and melts the frit seal 104. As the frit seal 104 cools, the frit seal 104 bonds the cover sheet 100 to the device substrate 218 and any electrical leads 215 extending from the electroluminescent device 216 thereby sealing the fritted cover sheet 100 to the device substrate 218 to form a hermetically sealed glass package such as, in this example, display device 220.

While FIGS. 7A and 7B depict the formation of a display device, such as an OLED display, it should be understood that the fritted cover sheets with frit seals formed as described herein may be used to seal other types of glass packages. Such glass packages may include, for example, photo-voltaic devices and similarly constructed glass packages which include a device substrate scaled with a fritted cover sheet.

Various modifications and variations can be made to the embodiments described herein without departing from the spirit and scope of the claimed subject matter. Thus it is intended that the specification cover the modifications and variations of the embodiments described herein provided such modifications and variations come within the scope of the appended claims and their equivalents.

What is claimed is:

1. A method for forming a fritted cover sheet comprising:
providing a glass substrate;
depositing an initial frit bead on the substrate to form a contiguous circuit defining a perimeter around a sealing area on the substrate; and
depositing at least one additional frit bead on the substrate along the contiguous circuit and adjacent to a previously deposited frit bead such that a base of the at least one additional frit bead overlaps a base of the respective adjacent frit bead thereby forming a frit seal on the substrate;
wherein the initial frit bead and the at least one additional frit bead have sidewalls which taper from the base towards a top surface of the respective frit bead.

2. The method of claim 1 wherein a width of the initial frit bead is less than about 1 mm and a width of the at least one additional frit bead is less than about 1 mm.

3. The method of claim 1 wherein a width of the frit seal is at least 1 mm.

4. The method of claim 1 wherein a top surface of the frit seal has variance in height of about +/−5.0 microns across the width of the frit seal.

5. The method of claim 1 wherein the base of the at least one additional frit bead overlaps the base of an adjacent frit bead by at least about 0.05 mm.

6. The method of claim 1 wherein the frit seal comprises at least three primary frit peaks and a spacing between adjacent primary frit peaks is less than about 1 mm.

7. The method of claim 1 wherein the frit seal is formed in a pattern which comprises a curved portion.

8. The method of claim 7 further comprising:
selecting an inner radius of curvature of the frit seal in the curved portion of the pattern;
selecting a frit bead width;
selecting an overlap amount;
calculating centerline radii for the initial frit bead and the at least one additional frit bead in the curved portion of the pattern based on the inner radius, the frit bead width and the overlap amount; and
forming the curved portion of the pattern by depositing the initial frit bead and at least one additional frit bead with the selected frit bead width and calculated centerline radii.

9. The method of claim 7 further comprising:
selecting a frit seal width;
selecting a number of frit bead deposition passes, wherein the number of frit bead deposition passes is at least 2;
selecting an inner radius of curvature of the frit seal in the curved portion of the pattern;
selecting an overlap amount; calculating a frit bead width for the initial frit bead and the at least one additional frit bead in the curved portion of the pattern based on the inner radius of curvature, the overall width of the frit seal, the number of frit bead deposition passes and the overlap amount;
calculating centerline radii for the initial frit bead and the at least one additional frit bead based on the calculated frit bead width and the selected inner radius of curvature; and
forming tile curved portion of the pattern by depositing the initial flit bead and the at least one additional frit bead with the calculated centerline radii.

10. A method for forming a glass package comprising:
providing a first glass substrate and a glass second substrate;
depositing an initial frit bead on the first substrate to form a contiguous circuit defining a perimeter around a sealing area on the first substrate;

depositing a second frit bead on the first substrate along the contiguous circuit and adjacent to the initial frit bead such that a base of the second frit bead overlaps a base of the initial frit bead to form a frame-like frit seal on the first substrate;

wherein the initial frit bead and the second frit bead have sidewalls which taper from the base towards a top surface of the respective frit bead;

positioning the first substrate on the second substrate such that the frit seal is disposed between the first substrate and the second substrate; and heating the frit seal to form a seal between the first substrate and the second substrate.

11. The method of claim 10 wherein an overlap between the second frit bead and the initial frit bead is at least 0.05 ram.

12. The method of claim 10 wherein the frit seal has a width greater than about 1 mm.

13. The method of claim 10 wherein the heating the frit seal comprises directing radiant energy onto the frit seal through the first substrate, wherein the first substrate is substantially transparent to at least one wavelength of radiant energy directed onto the frit seal.

14. The method of claim 10 wherein the second substrate comprises at least one electroluminescent device and, when the first substrate is positioned on the second substrate, the electroluminescent device is positioned within an area defined by the frame-like frit seal.

* * * * *